United States Patent
Ryu et al.

(10) Patent No.: US 10,418,661 B2
(45) Date of Patent: Sep. 17, 2019

(54) MICRO-BATTERY, AND PCB AND SEMICONDUCTOR CHIP USING SAME

(71) Applicant: REKRIX CO., LTD., Seoul (KR)

(72) Inventors: Byung Hoon Ryu, Seoul (KR); Jae Kyung Kong, Seoul (KR)

(73) Assignee: REKRIX CO., LTD., Seoul (KR)

( * ) Notice: Subject to any disclaimer, the term of this patent is extended or adjusted under 35 U.S.C. 154(b) by 284 days.

(21) Appl. No.: 15/328,403

(22) PCT Filed: Jul. 21, 2015

(86) PCT No.: PCT/KR2015/007587
§ 371 (c)(1),
(2) Date: Jan. 23, 2017

(87) PCT Pub. No.: WO2016/013862
PCT Pub. Date: Jan. 28, 2016

(65) Prior Publication Data
US 2017/0214093 A1   Jul. 27, 2017

(30) Foreign Application Priority Data
Jul. 22, 2014  (KR) .................. 10-2014-0092518

(51) Int. Cl.
*H01M 4/36* (2006.01)
*H01M 4/62* (2006.01)
(Continued)

(52) U.S. Cl.
CPC .......... *H01M 10/054* (2013.01); *H01L 23/58* (2013.01); *H01M 2/0262* (2013.01);
(Continued)

(58) Field of Classification Search
CPC .... H01M 2/026; H01M 2/0277; H01M 2/204; H01M 4/133; H01M 4/136; H01M 4/366;
(Continued)

(56) References Cited

U.S. PATENT DOCUMENTS

| | | | |
|---|---|---|---|
| 10,090,513 B2 * | 10/2018 | Canham | C01B 33/023 |
| 2003/0064292 A1 * | 4/2003 | Neudecker | D02G 3/441 |
| | | | 429/235 |

(Continued)

FOREIGN PATENT DOCUMENTS

| | | |
|---|---|---|
| CN | 102208632 A | 10/2011 |
| CN | 102308424 A | 1/2012 |

(Continued)

OTHER PUBLICATIONS

English translation of KR Publication 2013-0113749, Oct. 2013.*
(Continued)

*Primary Examiner* — Brittany L Raymond
(74) *Attorney, Agent, or Firm* — The PL Law Group, PLLC

(57) ABSTRACT

A solid silicon secondary battery, by substitutions of silicon for lithium, enables decreasing of preparations cost and minimizing of environmental pollutions. By laminate pressing multiple times a positive or negative electrode material, the present invention enables increasing of the density of a positive or negative electrode active material, thereby increasing current density and capacity. By having mesh plates equipped inside the positive electrode active material and the negative electrode active material, the present invention enables effective moving of electrons. By enabling common use of an electrode, of a silicon secondary battery, connected during a serial connections of the silicon secondary battery, the present invention enables decreasing of the thickness of a silicon secondary battery assembly and increasing of output voltage. By being integrally formed with a PCB or a chip and supplying a power source, the present invention plays the role of a backup power source for instant discharging.

19 Claims, 7 Drawing Sheets

(51) Int. Cl.
| | |
|---|---|
| *H01M 10/04* | (2006.01) |
| *H01M 10/0562* | (2010.01) |
| *H01M 10/0565* | (2010.01) |
| *H01M 10/0585* | (2010.01) |
| *H05K 1/18* | (2006.01) |
| *H01L 23/58* | (2006.01) |
| *H01M 10/054* | (2010.01) |
| *H01M 10/056* | (2010.01) |
| *H01M 10/36* | (2010.01) |
| *H01M 4/136* | (2010.01) |
| *H01M 4/133* | (2010.01) |
| *H01M 4/74* | (2006.01) |
| *H01M 4/583* | (2010.01) |
| *H01M 2/02* | (2006.01) |
| *H01M 2/20* | (2006.01) |
| *H01M 4/58* | (2010.01) |
| *H01M 4/66* | (2006.01) |
| *H01M 4/80* | (2006.01) |
| *H01M 2/10* | (2006.01) |
| *H01M 6/40* | (2006.01) |
| *H01M 4/02* | (2006.01) |
| *H01M 10/42* | (2006.01) |

(52) U.S. Cl.
CPC ....... *H01M 2/0277* (2013.01); *H01M 2/1072* (2013.01); *H01M 2/1077* (2013.01); *H01M 2/206* (2013.01); *H01M 4/133* (2013.01); *H01M 4/136* (2013.01); *H01M 4/366* (2013.01); *H01M 4/58* (2013.01); *H01M 4/583* (2013.01); *H01M 4/625* (2013.01); *H01M 4/661* (2013.01); *H01M 4/667* (2013.01); *H01M 4/668* (2013.01); *H01M 4/74* (2013.01); *H01M 4/80* (2013.01); *H01M 4/808* (2013.01); *H01M 10/0436* (2013.01); *H01M 10/056* (2013.01); *H01M 10/0562* (2013.01); *H01M 10/0565* (2013.01); *H01M 10/0585* (2013.01); *H01M 10/36* (2013.01); *H05K 1/181* (2013.01); *H01M 6/40* (2013.01); *H01M 10/425* (2013.01); *H01M 2004/025* (2013.01); *H01M 2004/029* (2013.01); *H01M 2220/20* (2013.01); *H01M 2220/30* (2013.01); *H01M 2300/0071* (2013.01); *H01M 2300/0082* (2013.01); *H01M 2300/0085* (2013.01); *H05K 2201/10037* (2013.01)

(58) Field of Classification Search
CPC ........ H01M 4/58; H01M 4/583; H01M 4/625; H01M 4/661; H01M 4/667; H01M 4/668; H01M 4/74; H01M 4/80; H01M 4/808; H01M 10/0436; H01M 10/054; H01M 10/056; H01M 10/0565; H01M 10/0585; H01M 10/36; H01M 10/425; H01M 2004/025; H01M 2004/029; H01M 2300/0065; H01M 2220/30; H05K 1/181; H05K 2201/10037; H01L 23/58
See application file for complete search history.

(56) References Cited

U.S. PATENT DOCUMENTS

2013/0266865 A1* 10/2013 Kwon ................... H01M 4/386
                                                                429/220
2014/0220407 A1    8/2014 Ichimura et al.

FOREIGN PATENT DOCUMENTS

| | | | |
|---|---|---|---|
| CN | 102403491 | A | 4/2012 |
| CN | 102576828 | A | 7/2012 |
| JP | H3-238772 | A | 10/1991 |
| JP | 2000-164466 | A | 6/2000 |
| JP | 2002-279974 | A | 9/2002 |
| JP | 2011-210666 | A | 10/2011 |
| JP | 2012-204160 | A | 10/2012 |
| JP | 2013-58421 | A | 3/2013 |
| JP | 2013080610 | A | 5/2013 |
| JP | 2014-26962 | A | 2/2014 |
| JP | 2014-41996 | A | 3/2014 |
| JP | 2014-49240 | A | 3/2014 |
| KR | 10-2008-0021945 | A | 3/2008 |
| KR | 10-2009-0073108 | A | 7/2009 |
| KR | 10-2010-0063194 | * | 6/2010 |
| KR | 10-2012-0071316 | A | 7/2012 |
| KR | 10-2013-0028636 | A | 3/2013 |
| KR | 10-2013-0113749 | * | 10/2013 |
| KR | 10-2013-0113749 | A | 10/2013 |
| WO | WO 2009/123031 | A1 | 10/2009 |
| WO | WO 2013/035387 | A1 | 3/2013 |
| WO | WO 2014/080895 | A1 | 5/2014 |

OTHER PUBLICATIONS

English translation of KR Publication 2010-0063194, Jun. 2010.*
International Search Report for PCT/KR2015/007587.
European Search Report for EP 15824589.4 dated May 2, 2017 from European patent office in a counterpart European patent application.
Office action dated Nov. 1, 2018 from China Patent Office in a counterpart China Patent Application No. 201580039492.8 (English translation is also submitted herewith.).

* cited by examiner

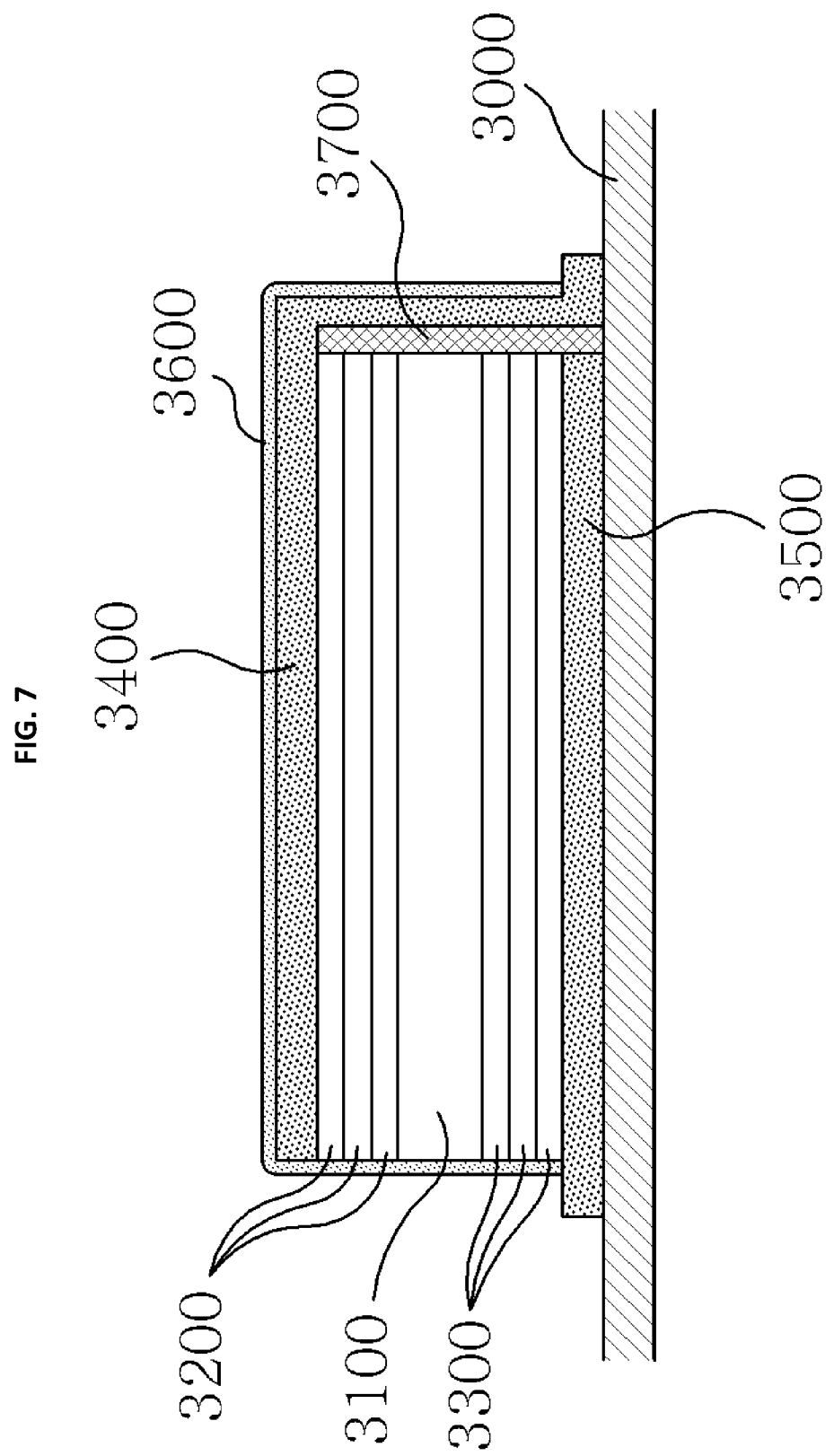

MICRO-BATTERY, AND PCB AND SEMICONDUCTOR CHIP USING SAME

CROSS REFERENCE TO RELATED APPLICATIONS AND CLAIM OF PRIORITY

This application claims benefit under 35 U.S.C. 119(e), 120, 121, or 365(c), and is a National Stage entry from International Application No. PCT/KR2015/007587, filed Jul. 21, 2015, which claims priority to the benefit of Korean Patent Application No. 10-2014-0092518 filed in the Korean Intellectual Property Office on Jul. 22, 2014, the entire contents of which are incorporated herein by reference.

TECHNICAL FIELD

The present invention relates to a micro-battery unit and a PCB substrate and semiconductor chip using the same.

BACKGROUND ART

As a secondary battery is a battery which converts chemical energy into electrical energy to supply power to an external circuit and, when the battery is discharged, receives external power and converts electrical energy into chemical energy so that electricity is stored therein, the secondary battery is generally referred to as a storage battery.

Such secondary batteries include lead storage batteries, nickel-cadmium secondary batteries, lithium secondary batteries, and so on. A lead storage battery is used for a vehicle because the lead storage battery has a high voltage but is bulky and heavy, a nickel-cadmium secondary battery is used as a substitute for a dry cell, and a lithium secondary battery is used for a power source of cameras, mobile phones, and so on because the lithium secondary battery is very light. The lithium secondary batteries among the above described secondary batteries have been widely used due to popularization of personal portable terminals such as smart phones and tablet personal computers (tablet PCs), which have been rapidly increasing recently.

However, in a lithium secondary battery, lithium as a main material is considerably expensive, and when a lithium secondary battery of which lifetime is over is discarded, there is a problem in that lithium is discharged from a waste disposal place and environmental pollution is involved.

Therefore, there is an urgent need to develop a high-power secondary battery that can replace a lithium secondary battery.

SUMMARY

A first object of the present invention is to provide a high output power and high efficiency silicon secondary battery capable of replacing a lithium secondary battery.

A second object of the present invention is to provide a silicon secondary battery capable of increasing the current density and capacity thereof by increasing the density of a positive or negative electrode active material by manufacturing the positive or negative electrode active material by stacking and pressing positive or negative electrode materials several times.

A third object of the present invention is to provide a silicon secondary battery capable of efficiently moving electrons by including a mesh plate in a positive electrode active material and a negative electrode active material.

A fourth object of the present invention is to provide a silicon secondary battery assembly capable of reducing a thickness of the silicon secondary battery assembly and increasing an output voltage thereof by sharing an electrode of a silicon secondary battery which is used for a serial connection of the silicon secondary battery.

A fifth object of the present invention is to provide a silicon secondary battery capable of serving as a backup power source against instantaneous discharging by being formed integrally with a printed circuit board (PCB) or chip and supplying power.

One aspect of the present invention provides a micro-battery including a silicon secondary battery, wherein the silicon secondary battery includes: a first silicon multilayer thin film part in which a plurality of silicon positive electrode thin film layers each formed of a first silicon compound, which generates silicon cations when the silicon secondary battery is charged and generates silicon anions when the silicon secondary battery is discharged, are stacked; a second silicon multilayer thin film part in which a plurality of silicon negative electrode thin film layers each formed of a second silicon compound, which generates silicon anions when the silicon secondary battery is charged and generates silicon cations when the silicon secondary battery is discharged, are stacked; and a solid electrolyte layer located between the first silicon multilayer thin film part and the second silicon multilayer thin film part and configured to deliver silicon ions between the first silicon multilayer thin film part and the second silicon multilayer thin film part when the silicon secondary battery is charged and discharged.

A positive electrode collector may be bonded to one side surface of the first silicon multilayer thin film part, and a negative electrode collector may be bonded to one side surface of the second silicon multilayer thin film part.

One side end of the positive electrode collector may be bonded to a substrate.

At least a part of portions of the negative electrode collector except for a surface of the negative electrode collector in contact with the second silicon multilayer thin film part may be bonded to a substrate.

A space may be formed between the positive electrode collector and at least side portions of the second silicon multilayer thin film part, the solid electrolyte layer, and the negative electrode collector so that the second silicon multilayer thin film part, the solid electrolyte layer, and the negative electrode collector are insulated from the positive electrode collector.

The space may be filled with an insulating material.

The first silicon compound and/or the second silicon compound may include elastic carbon.

The first silicon compound and/or the second silicon compound may further include conductive carbon.

The elastic carbon may include fullerene or expanded graphite.

The first silicon compound and/or the second silicon compound may include inactive material particles.

The first silicon compound and/or the second silicon compound may further include conductive carbon or a conductive polymer.

The positive electrode thin film layer and/or the negative electrode thin film layer may be formed in a mesh shape.

The first silicon multilayer thin film part and/or the second silicon multilayer thin film part may include an interlayer formed of a metal or carbon allotrope.

The interlayer may be thinner than the first silicon multilayer thin film part and the second silicon multilayer thin film part.

The metal may include any one selected among aluminum, gold, and silver or an alloy containing two or more of aluminum, gold, and silver.

The carbon allotrope may include any one selected among graphene, a carbon nanotube, and fullerene.

Concave-convex shapes may be formed on one surface or both surfaces of the positive electrode thin film layer and/or the negative electrode thin film layer.

A printed circuit board (PCB) substrate having a portion on which the micro-battery is mounted as a backup power source.

A semiconductor chip having a portion integrated with the micro-battery serving as a backup power source using a deposition method.

Therefore, the present invention has the following effects.

First, by replacing lithium of a secondary battery with silicon, it is possible to reduce manufacturing costs and minimize environmental pollutions when the secondary battery is discarded.

Second, the current density and capacity of a silicon secondary battery can be increased by increasing the density of a positive or negative electrode active material by manufacturing the positive or negative electrode active material by stacking and pressing positive or negative electrode materials several times.

Third, by including a mesh plate in a positive electrode active material and a negative electrode active material, electrons can be efficiently moved.

Fourth, since an electrode of a silicon secondary battery used for a serial connection of the silicon secondary battery is shared, a thickness of a silicon secondary battery assembly can be reduced and an output voltage thereof can be increased.

Fifth, a silicon secondary battery can serve as a backup power source against instantaneous discharging by being formed integrally with a printed circuit board (PCB) or chip and supplying power.

BRIEF DESCRIPTION OF THE DRAWING

FIG. 7 is a view illustrating an example of a micro-battery according to a sixth embodiment of the present invention.

DETAILED DESCRIPTION

Figure 1:
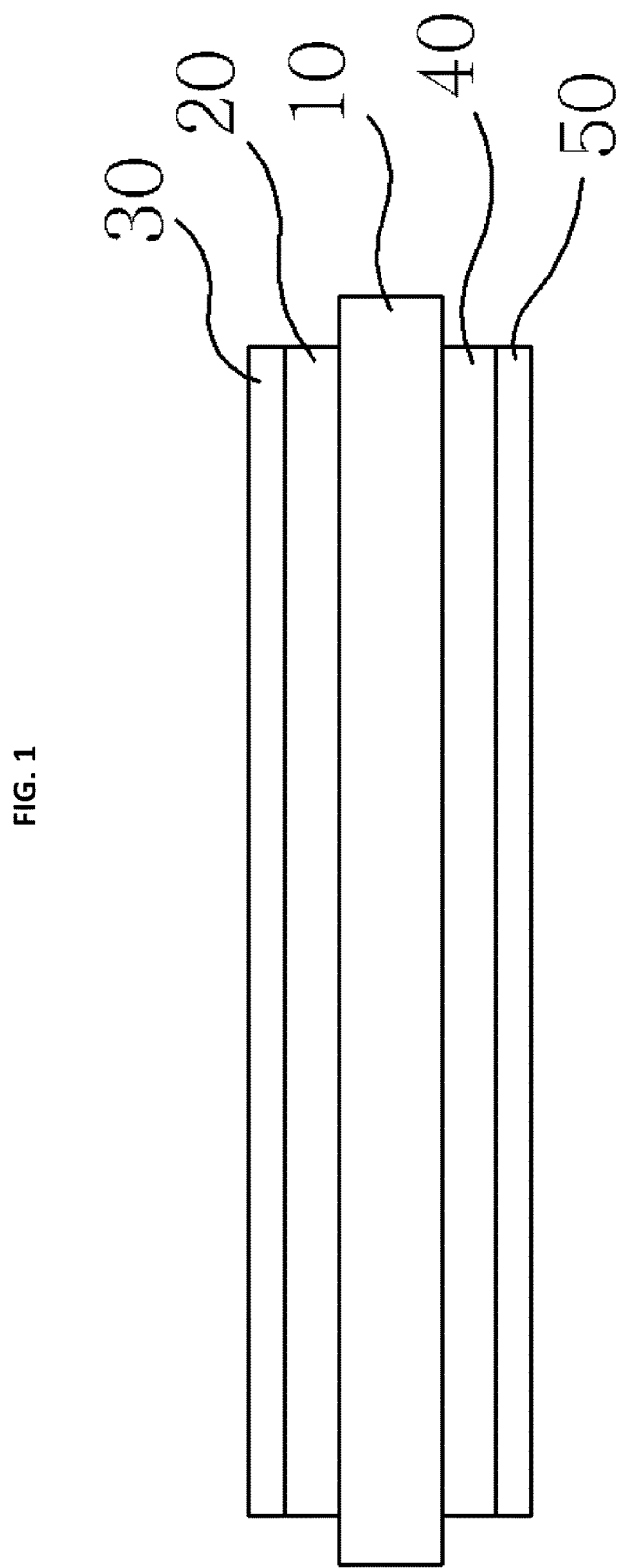
FIG. 1 is a view illustrating a structure of a silicon secondary battery according to the present invention.

The terms and words used in the present specification and claims should not be construed as limited to ordinary or dictionary meaning, and should be interpreted as a meaning and concept corresponding to the technical concept of the present invention based on the principle that the concept of the term may be appropriately defined by the inventor in order to explain the invention of the inventor in the best way.

Therefore, the embodiments described in the present specification and the configurations shown in the drawings are only the most preferred embodiments of the present invention and are not intended to represent all of the technical concepts of the present invention. Further, it should be understood that various equivalents and modifications may be present at the time of filing the application. In the following description, well-known functions or constructions are not described in detail when they are determined to obscure the gist of the present invention.

Hereinafter, a silicon secondary battery according to an exemplary embodiment of the present invention and a method of manufacturing the same will be described with reference to the accompanying drawings.

As the silicon secondary battery according to the present invention relates to a secondary battery charged and discharged using silicon ions, as shown in FIG. 1, the silicon secondary battery includes a positive electrode active material layer 20 which generates silicon cations when the silicon secondary battery is charged and generates silicon anions when the silicon secondary battery is discharged, a negative electrode active material layer 40 which generates silicon anions when the silicon secondary battery is charged and generates silicon cations when the silicon secondary battery is discharged, and a solid electrolyte layer 10 located between the positive electrode active material layer 20 and the negative electrode active material layer 40 and configured to deliver silicon ions between the positive electrode active material layer 20 and the negative electrode active material layer 40 when the silicon secondary battery is charged and discharged.

Further, referring to FIG. 1, a positive electrode collector 30 is bonded to the positive electrode active material layer 20, and a negative electrode collector 50 is bonded to the negative electrode active material layer 40.

Referring to FIG. 1, the positive electrode collector 30 is provided with a metal plate having a predetermined thickness, and one side thereof is coated with the positive electrode active material layer 20. The positive electrode active material layer 20 may be provided with silicon carbide (SiC) but is not limited thereto. For example, the positive electrode active material layer 20 may include silicon carbide (SiC) to which a small amount of germanium (Ge) is added. This may be made by doping, and a positive electrode active material may be used by adding an element located in the same group as a group including carbon (C) in a periodic table of the elements.

The negative electrode collector 50 is provided with a metal plate having a predetermined thickness of which one side is coated with the negative electrode active material layer 40. The negative electrode active material layer 40 may be formed of silicon nitrate ($Si_3N_4$) but is not limited thereto. For the negative electrode active material layer 40, silicon nitrate ($Si_3N_4$), to which a small amount of an element located in the same group as a group including nitrogen (N) of a periodic table of the elements is added, may be also used as a negative electrode active material.

To describe the above doping again, an electrode serves to generate a voltage by a potential difference caused by the deviation of electrons generated in an ionization process. Silicon has bipolarity as an element having an ionization degree of +4. In this bipolarity, a silicon electrode doped with N and C is used for ease of electron deviation and ease of acceptance. However, silicon carbide and silicon nitrate are a hexagonal crystalline material, electron transfer in a crystalline phase is easy to occur on crystalline surfaces thereof, and in particular, an electron deviation phenomenon may be changed according to crystalline orientation thereof. By adding a transition metal, such as Al, Fe, Mg, Zn, or Mn, to a raw material of silicon carbide and silicon nitrate, the crystalline orientation is changed so that deviation and acceptance of electrons may be easily controlled. Electron mobility may be controlled by adding a four or five periodic transition metal, which has a greater ion diameter than that of silicon, so as to provide orientation to crystals. When elements such as Al, P, S, Mg, and Na, which are three periodic elements having a similar diameter to that of silicon, are added in combination, the change in a shape of a crystalline phase can be minimized and the degree of electron deviation can be controlled.

Meanwhile, the solid electrolyte layer 10 is a nonaqueous electrolyte which is in a fixed state and may be provided with an ion exchange resin made of a polymer, an ion exchange inorganic compound made of a metal oxide, or the like. For the ion exchange resin, any one of polymers having any type among a cationic sulfonic acid group (—$SO_3H$), a carboxyl group (—COOH), an anionic quaternary ammonium group (—$N(CH_3)_2C_2H_4OH$), a substituted amino group (—$NH(CH_3)$), and the like as a binder may be employed. Among the above polymers, polyacrylamide methyl propane sulfonic acid (PAMPS) having the sulfonic acid group (—$SO_3H$) may be suitably employed in terms of smoothly moving electrons ($e^-$).

The solid electrolyte layer 10 described above enhances the usability of a battery by adding a polymer to an electrolyte for providing a fixing property of a gel-like shape. However, since a polymer is composed of a chain composed of a single bond or a chain composed of a double bond, electron density is very low when only electrons are shared in the chain and electron mobility is lower than when a liquid electrolyte is used alone. Such a polymer has to transport large quantities of electrons and ions in a short period of time and further improve the fixability of a liquid electrolyte to improve safety and stability. A polymer for liquid phase fixation requires a high molecular weight material for high viscosity but tends to lower the conductivity of the polymer with increasing molecular weight, and thus two or more types of polymers with a low molecular weight and a low polymerization degree for high conductivity and a polymer with a high polymerization degree for high viscosity may be mixed to compensate for ion mobility and electron mobility.

As described above, the positive electrode collector 30 and the negative electrode collector 50 coated with the positive electrode active material layer 20 and the negative electrode active material layer 40 are combined with the solid electrolyte layer 10 to form a silicon secondary battery. At this time, the positive electrode active material layer 20 and the negative electrode active material layer 40 are bonded to be in contact with both surfaces of the solid electrolyte layer 10.

The silicon secondary battery constructed as described above is charged and discharged by movement of electrons to serve as a battery.

In the above-described silicon secondary battery, electrons move toward the negative electrode collector 50 when a current is applied to the positive electrode collector 30. As a first step, the transferred electrons make excess electrons to be stored when compared with a voltage equilibrium state due to an electric field generated by forming dipole in the solid electrolyte layer 10, and charging speed is very fast. Electrons charged by electromagnetic force move to an interface of a negative electrode active material layer 40 side of the solid electrolyte layer 10, fill silicon holes existing on a surface of the negative electrode active material layer 40, and are sequentially moved. In this process, silicon carbide molecules existing in the negative electrode active material layer 40 are physically bonded. When the negative electrode active material layer 40 is saturated with electrons by processing the physical bonding for a predetermined period of time, the electrons maintain the physical bonding, and ultimately the electrons transferred by the current applied to the positive electrode collector 30 are chemically bonded with silicon carbide contained in the negative electrode active material layer 40, thereby completing a chemical charge inside the battery. Therefore, the silicon secondary battery simultaneously has physical fast charge characteristics and chemical stable charge characteristics.

In the present invention, the positive electrode active material layer 20 and/or the negative electrode active material layer 40 may include elastic carbon to prevent the degradation of the charge and discharge characteristics of the active material layer because the volume of the active material layer is increased as the silicon secondary battery is repeatedly charged and discharged. Since the positive electrode active material layer 20 and/or the negative electrode active material layer 40 include elastic carbon, even when silicon particles are enlarged due to repeated charge and discharge, a volume offset effect may be shown by the elastic carbon, thereby suppressing the bulking of the entire active material layer.

However, when the positive electrode active material layer 20 and/or the negative electrode active material layer 40 include elastic carbon, since ion mobility or electron conductivity may be slightly lowered due to a gap between silicon particles and elastic carbon, in order to compensate for this, it may be preferable to further include conductive carbon or to use fullerene simultaneously having elasticity and high ion mobility or electron conductivity as the elastic carbon.

As another example, in the present invention, the positive electrode active material layer 20 and/or the negative electrode active material layer 40 may include inactive material particles, which do not participate in a bulking reaction of the active material layer, to prevent the degradation of the charge and discharge characteristics caused when the volume of the active material layer is increased as the silicon secondary battery is repeatedly charged and discharged. The inactive material particles are one or more metal particles selected from the group consisting of Mo, Cu, Fe, Co, Ca, Cr, Mg, Mn, Nb, Ni, Ta, Ti, and V.

However, when the positive electrode active material layer 20 and/or the negative electrode active material layer 40 include the inactive material particles as described above, since an electric capacity of the silicon secondary battery may be slightly reduced, it may be preferable to further include conductive carbon or conductive polymer.

In the present invention, the positive electrode active material layer 20 and/or the negative electrode active material layer 40 may have any shape which may form a layer, but it may be preferable to have a mesh shape to minimize the risk of breakage of the active material layer due to contraction and expansion of the active material layer caused by repeatedly charging and discharging the silicon secondary battery.

In the present invention, the positive electrode active material layer 20 and/or the negative electrode active material layer 40 are not particularly limited in a surface shape, but it is preferable that an interface contact area with the solid electrolyte layer 10 and/or the positive and negative electrode collectors 30 and 50 be widen and concavo-convex shapes be formed on one or both surfaces of the active material layer to reduce interfacial resistance.

In the solid electrolyte layer 10 of the present invention, in order to increase battery capacity by reducing interfacial resistance between the solid electrolyte layer and the positive electrode active material layer, it may be preferable that a first interlayer (not shown) including a positive electrode active material layer component and a solid electrolyte component be formed between the solid electrolyte layer and the positive electrode active material layer.

A content ratio of components of the first interlayer is not particularly limited, but it is preferable that the content of the positive electrode active material layer component be larger than that of the solid electrolyte component to further increase the electric capacity of the silicon secondary battery, and a thickness of the first interlayer is not particularly limited either, but it is preferable that the thickness be smaller than a thickness of the solid electrolyte layer and/or the positive electrode active material layer to further increase the electric capacity of the silicon secondary battery.

Further, it is preferable that the first interlayer have protrusions formed on one or both surfaces thereof to further reduce interface resistance with an adjacent layer.

As another example, in the solid electrolyte layer 10 of the present invention, in order to increase battery capacity by reducing interfacial resistance between the solid electrolyte layer and the negative electrode active material layer, it may be preferable that a second interlayer (not shown) including a negative electrode active material layer component and a solid electrolyte component be formed between the solid electrolyte layer and the negative electrode active material layer.

A content ratio of components of the second interlayer is not particularly limited, but it is preferable that the content of the negative electrode active material layer component be larger than that of the solid electrolyte component to further increase the electric capacity of the silicon secondary battery, and a thickness of the second interlayer is not particularly limited either, but it is preferable that the thickness be smaller than a thickness of the solid electrolyte layer and/or the negative electrode active material layer to further increase the electric capacity of the silicon secondary battery.

Further, it is preferable that the second interlayer have protrusions formed on one or both surfaces thereof to further reduce interface resistance with an adjacent layer.

Meanwhile, the solid electrolyte layer 10 may preferably include one or more among polyvinylidene fluoride (PVDF) and polytetrafluoroethylene (PTFE) in order to further increase mechanical strength and improve processability, and in this case, it may be more preferable to further include conductive polymer because electron conductivity thereof may be reduced slightly.

In the present invention, the positive electrode collector 30 and the negative electrode collector 50 are respectively bonded to the positive electrode active material layer and the negative electrode active material layer and collect charges, and stainless steel, nickel, or the like may be used as materials of the positive electrode collector 30 and the negative electrode collector 50.

The positive electrode collector and/or the negative electrode collector are not particularly limited in shape, but it may be preferable to have a porous net shape or a foamed shape to reduce interfacial resistance by increasing an interface contact area between the collector and the active material layer. The porous net shape may be a two-dimensional planar porous net shape or a three-dimensional porous net shape.

Further, when the positive electrode collector and/or the negative electrode collector are formed in a porous or foamed shape, any one of gold, silver and a conductive polymer may be coated on a surface of the positive electrode collector and/or the negative electrode collector, thereby further increasing the electron and ion conductivity of the collector and further reducing the interfacial resistance. In particular, when the surface is coated with the conductive polymer, interfacial adhesion may be further enhanced because the conductive polymer acts as a conductive agent and also acts as a binder. The conductive polymer may be any type of polymer having conductivity, but it is preferable to use any one selected from the group consisting of polypyrrole, polyaniline, polythiophene, and polyacetylene in view of improving conductivity and interfacial adhesion of the collector.

<First Embodiment>

Figure 2:
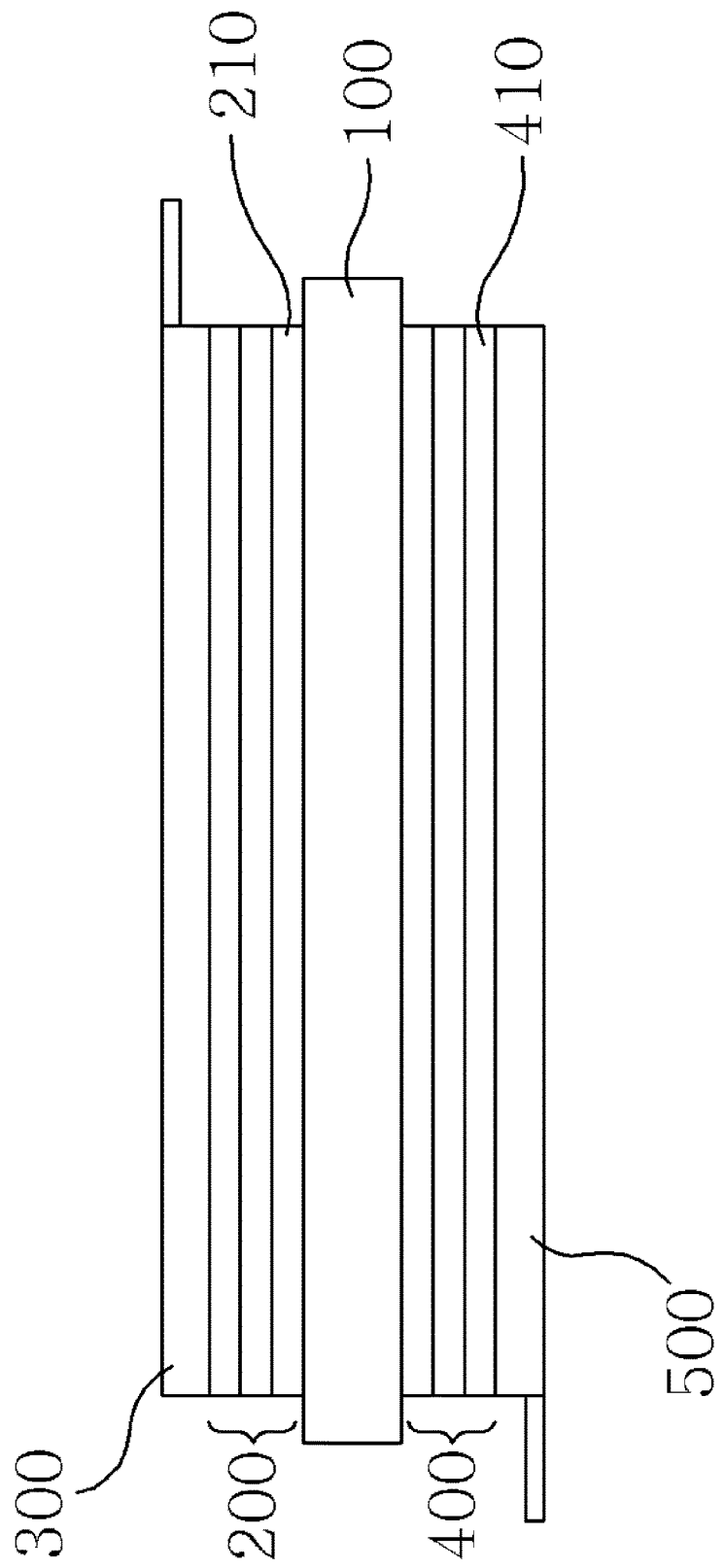
FIG. 2 is a view illustrating a structure of a silicon secondary battery according to a first embodiment of the present invention.

Hereinafter, a silicon secondary battery according to a first embodiment of the present invention will be described in detail with reference to FIG. 2.

The silicon secondary battery according to the first embodiment of the present invention includes a first silicon multilayer thin film part 200 in which a plurality of silicon positive electrode thin film layers 210 formed of a first silicon compound, which generates silicon positive ions when the silicon secondary battery is charged and generates silicon negative ions when the silicon secondary battery is discharged, are stacked, a collector 300 bonded to the first silicon multilayer thin film part 200, and a second silicon multilayer thin film part 400 in which a plurality of silicon negative electrode thin film layers each formed of a second silicon compound, which generates silicon negative ions when the silicon secondary battery is charged and generates silicon positive ions when the silicon secondary battery is discharged, are stacked, a collector 500 bonded to the second silicon multilayer thin film part 400, and a solid electrolyte layer 100 located between the first silicon multilayer thin film part 200 and the second silicon multilayer thin film part 400 and configured to deliver silicon ions between the first silicon multilayer thin film part 200 and the second silicon multilayer thin film part 400 when the silicon secondary battery is charged and discharged.

The first silicon multilayer thin film part 200 is formed by stacking and pressing a plurality of silicon positive electrode thin film layers 210. The silicon positive electrode thin film layer 210 is formed by pressing a first silicon compound mixed with a bonding material. Alternatively, the silicon positive electrode thin film layer 210 may be formed by pressing a first silicon compound coated with a bonding material. The plurality of silicon positive electrode thin film layers 210 each formed as described above are stacked and pressurized to form the first silicon multilayer thin film part 200. Here, the first silicon compound may be provided with silicon carbide, and the bonding material may be provided with a polymeric crosslinking agent.

The first silicon multilayer thin film part 200 formed as described above is bonded to the collector 300 so that a positive electrode collector is formed. Here, the collector 300 may be formed of a metal material in a porous net shape, and a terminal for supplying a current may be formed on an end portion thereof. Here, the first silicon multilayer thin film part 200 may be bonded to the collector 300 using a separate bonding material or bonding member, or using a simple attachment, printing, or pressing manner.

Meanwhile, the second silicon multilayer thin film part 400 is formed by stacking and pressing a plurality of silicon negative electrode thin film layers 410. The silicon negative electrode thin film layer 410 is formed by pressing a second silicon compound mixed with a bonding material. Alternatively, the silicon negative electrode thin film layer 410 may be formed by pressing a second silicon compound coated with a bonding material. The plurality of silicon negative electrode thin film layers 410 each formed as described above are stacked and pressurized to form the second silicon multilayer thin film part 400. Here, the second silicon compound may be provided with silicon nitrate, and the bonding material may be provided with a polymeric cross-linking agent.

The second silicon multilayer thin film part 400 formed as described above is bonded to the collector 500 so that a negative electrode collector is formed. Here, the collector 500 may be formed of a metal material in a porous net shape, and a terminal for supplying a current may be formed on an end portion thereof. Here, the second silicon multilayer thin film part 400 may be bonded to the collector 500 using a separate bonding material or bonding member, or using a simple attachment, printing, or pressing manner.

The positive electrode and negative electrode collectors formed as described above are bonded to the solid electrolyte layer 100 so that the first and second silicon multilayer thin film parts 200 and 400 are in contact with an outer surface of the solid electrolyte layer 100. Here, the first and second silicon multilayer thin film parts 200 and 400 may be bonded to the solid electrolyte layer 100 using a separate bonding material or bonding member, or using a simple attachment, printing, spraying, or pressing manner. Here, the solid electrolyte layer 100 is formed to have a greater width than the first and second silicon multilayer thin film parts 200 and 400 to prevent a short circuit between a positive electrode and negative electrode.

In the above described silicon secondary battery according to the first embodiment of the present invention, the first or second silicon multilayer thin film part 200 or 400 is manufactured by stacking and pressing the first silicon compound or second silicon compound multiple times, and thus the density of the first or second silicon multilayer thin film part 200 or 400 is increased and the current density and capacity of the silicon secondary battery can be increased.

In the solid electrolyte layer 100 of the first embodiment of the present invention, it is preferable to form a first interlayer including a first silicon compound and a solid electrolyte component between the solid electrolyte layer and the first silicon multilayer thin film part in order to increase battery capacity by decreasing interfacial resistance between the solid electrolyte layer and the first silicon multilayer thin film part.

A content ratio of components of the first interlayer is not particularly limited, but it is preferable that the content of the first silicon compound be larger than that of the solid electrolyte component to further increase the electric capacity of the silicon secondary battery, and a thickness of the first interlayer is not particularly limited either, but it is preferable that the thickness be smaller than a thickness of the solid electrolyte layer and/or the first silicon multilayer thin film part to further increase the electric capacity of the silicon secondary battery.

Further, it is preferable that the first interlayer have protrusions formed on one or both surfaces thereof to further reduce interface resistance with an adjacent layer.

As another example, in the solid electrolyte layer 100 of the first embodiment of the present invention, it is preferable to form a second interlayer including a second silicon compound and a solid electrolyte component between the solid electrolyte layer and the second silicon multilayer thin film part in order to increase battery capacity by decreasing interfacial resistance between the solid electrolyte layer and the second silicon multilayer thin film part.

A content ratio of components of the second interlayer is not particularly limited, but it is preferable that the content of the second silicon compound be larger than that of the solid electrolyte component to further increase the electric capacity of the silicon secondary battery, and a thickness of the second interlayer is not particularly limited either, but it is preferable that the thickness be smaller than a thickness of the solid electrolyte layer and/or the second silicon multilayer thin film part to further increase the electric capacity of the silicon secondary battery.

Further, it is preferable that the second interlayer have protrusions formed on one or both surfaces thereof to further reduce interface resistance with an adjacent layer.

Meanwhile, the solid electrolyte layer 100 may preferably include one or more among PVDF and PTFE in order to further increase mechanical strength and improve processability, and in this case, it may be more preferable to further include a conductive polymer because electron conductivity thereof may be reduced slightly.

<Second Embodiment>

Figure 3:
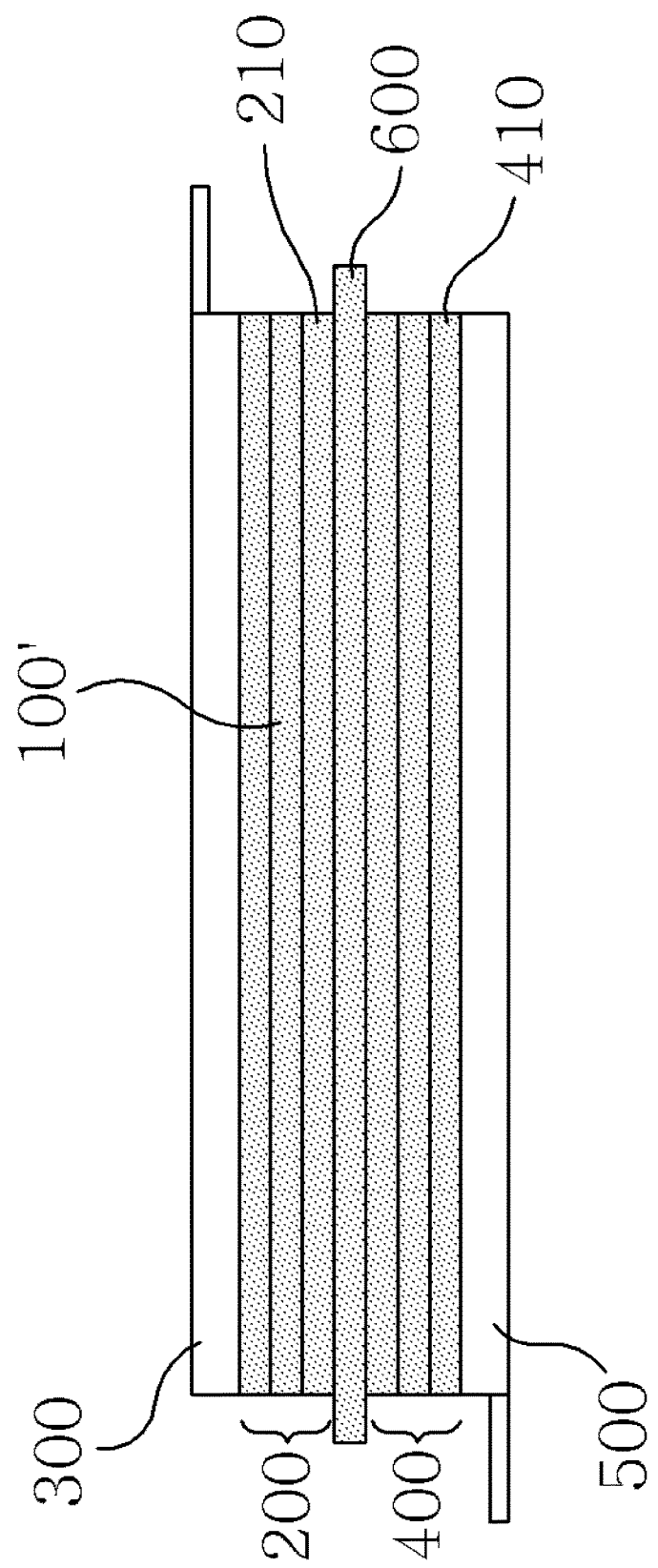
FIG. 3 is a view illustrating a structure of a silicon secondary battery according to a second embodiment of the present invention.

Hereinafter, a silicon secondary battery according to a second embodiment of the present invention will be described in detail with reference to FIG. 3.

The silicon secondary battery according to the second embodiment of the present invention includes a first silicon multilayer thin film part 200 in which a plurality of silicon positive electrode thin film layers 210 formed of a first silicon compound, which generates silicon cations when the silicon secondary battery is charged and generates silicon anions when the silicon secondary battery is discharged, are stacked, a collector 300 bonded to the first silicon multilayer thin film part 200, a second silicon multilayer thin film part 400 in which a plurality of silicon negative electrode thin film layers 410 formed of a second silicon compound, which generates silicon anions when the silicon secondary battery is charged and generates silicon cations when the silicon secondary battery is discharged, are stacked, a collector 500 bonded to the second silicon multilayer thin film part 400, a separation layer 600 located between the first silicon multilayer thin film part 200 and the second silicon multilayer thin film part 400, a liquid electrolyte 100' for delivering silicon ions between the first silicon multilayer thin film part 200 and the second silicon multilayer thin film part 400 when the silicon secondary battery is charged and discharged.

The first silicon multilayer thin film part 200 is formed by stacking and pressing a plurality of silicon positive electrode thin film layer 210. The silicon positive electrode thin film layer 210 is formed by pressing a first silicon compound mixed with a bonding material. Alternatively, the silicon positive electrode thin film layer 210 may be formed by pressing a first silicon compound coated with a bonding material. The plurality of silicon positive electrode thin film layers 210 each formed as described above is stacked and pressurized to form the first silicon multilayer thin film part 200. Here, the first silicon compound may be provided with silicon carbide, and the bonding material may be provided with a polymeric crosslinking agent.

The first silicon multilayer thin film part 200 formed as described above is bonded to the collector 300 so that a positive electrode collector is formed. Here, the collector 300 may be formed of a metal material in a porous net shape, and a terminal for supplying a current may be formed on an end portion thereof. Here, the first silicon multilayer thin film part 200 may be bonded to the collector 300 using a separate bonding material or bonding member, or using a simple attachment, printing, or pressing manner.

Meanwhile, the second silicon multilayer thin film part 400 is formed by stacking and pressing a plurality of silicon negative electrode thin film layers 410. The silicon negative electrode thin film layer 410 is formed by pressing a second silicon compound mixed with a bonding material. Alternatively, the silicon negative electrode thin film layer 410 may be formed by pressing a second silicon compound coated with a bonding material. The plurality of silicon negative electrode thin film layers 410 each formed as described above are stacked and pressurized to form the second silicon multilayer thin film part 400. Here, the second silicon compound may be provided with silicon nitrate, and the bonding material may be provided with a polymeric cross-linking agent.

The second silicon multilayer thin film part 400 formed as described above is bonded to the collector 500 so that a negative electrode collector is formed. Here, the collector 500 may be formed of a metal material in a porous net shape, and a terminal for supplying a current may be formed on an end portion thereof. Here, the second silicon multilayer thin film part 400 may be bonded to the collector 500 using a separate bonding material or bonding member, or using a simple attachment, printing, or pressing manner.

In the positive electrode and negative electrode collectors formed as described above, the separation layer 600 is interposed between the first and second silicon multilayer thin film parts 200 and 400 to prevent a short circuit between a positive electrode and a negative electrode. Further, the first and second silicon multilayer thin film parts 200 and 400 are bonded to the separation layer 600 to be formed in an impregnated form in the liquid electrolyte 100'.

In the above described silicon secondary battery according to the second embodiment of the present invention, the first or second silicon multilayer thin film part 200 or 400 is manufactured by stacking and pressing the first silicon compound or second silicon compound multiple times, and thus the density of the first or second silicon multilayer thin film part 200 or 400 is increased and the current density and capacity of the silicon secondary battery can be increased.

In the first and second embodiments of the present invention, the first silicon compound and/or the second silicon compound may include elastic carbon to prevent the degradation of the charge and discharge characteristics of an active material layer because the volume of the active material layer is increased as the silicon secondary battery is repeatedly charged and discharged. Since the first silicon compound and/or the second silicon compound include elastic carbon, even when silicon particles are enlarged due to repeated charge and discharge, a volume offset effect may be shown by the elastic carbon, thereby suppressing the bulking of the entire active material layer.

However, when the first silicon compound and/or the second silicon compound include elastic carbon, since ion mobility or electron conductivity may be slightly lowered due to a gap between silicon particles and elastic carbon, in order to compensate for this, it may be preferable to further include conductive carbon or to use fullerene simultaneously having elasticity and high ion mobility or electron conductivity as the elastic carbon.

Further, in the first and second embodiments of the present invention, the first silicon compound and/or the second silicon compound may include inactive material particles, which do not participate in a bulking reaction of the active material layer, to prevent the degradation of the charge and discharge characteristics caused when the volume of the active material layer is increased as the silicon secondary battery is repeatedly charged and discharged. The inactive material particles are one or more metal particles selected from the group consisting of Mo, Cu, Fe, Co, Ca, Cr, Mg, Mn, Nb, Ni, Ta, Ti, and V.

However, when the first silicon compound and/or the second silicon compound include the inactive material particles as described above, since the electric capacity of the silicon secondary battery may be slightly reduced, it may be preferable to further include conductive carbon or conductive polymer.

In the first and second embodiments of the present invention, the positive electrode thin film layer and/or the negative electrode thin film layer may have any shape which may form a layer, but it may be preferable to have a mesh shape to minimize the risk of breakage of the thin film layer due to contraction and expansion of the positive electrode thin film layer and/or the negative electrode thin film layer caused by repeatedly charging and discharging the silicon secondary battery.

In the first and second embodiments of the present invention, the positive electrode thin film layer and/or the negative electrode thin film layer are not particularly limited in a surface shape, but it is preferable that an interface contact area with an adjacent layer be widen and concavo-convex shapes be formed on one or both surfaces of the thin film layer to reduce interfacial resistance.

In the first and second embodiments of the present invention, the first silicon multilayer thin film part and/or the second silicon multilayer thin film part may be preferable to include an interlayer formed of a metal or carbon allotrope to improve charge and discharge characteristics and to secure uniform ion conductivity.

A thickness of the interlayer is not particularly limited, but it may be preferable that the thickness be smaller than those of the first silicon multilayer thin film part and the second silicon multilayer thin film part in view of increasing an electric capacity thereof.

A metal included in the interlayer may be any metal having high electric conductivity, but it may be preferable to use one selected among aluminum, gold, and silver or an alloy containing two or more of aluminum, gold, and silver in view of maximizing the performance of charge and discharge of a battery.

Further, a type of carbon allotrope included in the interlayer is not particularly limited, but it may be preferable to use one selected among graphene, a carbon nanotube, and fullerene in view of securing uniform ion conductivity in an electrode.

Hereinafter, a method of manufacturing the silicon secondary battery according to the first and second embodiments of the present invention will be described.

The method of manufacturing the silicon secondary battery according to the first and second embodiments of the present invention includes manufacturing a first silicon multilayer thin film part by repeatedly stacking a plurality of silicon positive electrode thin film layers each formed of a first silicon compound, manufacturing a positive electrode collector by bonding the first silicon multilayer thin film part to a collector, manufacturing a second silicon multilayer thin film part by repeatedly stacking a plurality of silicon negative electrode thin film layers each formed of a second silicon compound, manufacturing a negative electrode collector by bonding the second silicon multilayer thin film part to a collector, and bonding the first and second silicon multilayer thin film parts to an electrolyte part.

First, the manufacturing of the first silicon multilayer thin film part is started from mixing the first silicon compound and a bonding material. Here, the first silicon compound may be provided with silicon carbide, and the bonding material may be provided with a polymeric crosslinking agent.

When the first silicon compound and the bonding material are mixed as described above, the silicon positive electrode thin film layer in a thin film shape is manufactured by pressing the mixed material.

The plurality of silicon positive electrode thin film layers manufactured as described above are stacked and pressurized to manufacture the first silicon multilayer thin film part.

When the first silicon multilayer thin film part is manufactured by the above described manner, moldability thereof is high but internal resistance of a battery may be increased because pores are generated in the first silicon multilayer thin film part.

Further, the first silicon multilayer thin film part may be manufactured as described below.

Each particle of the first silicon compound is coated with a bonding material, and the coated first silicon compound is dried and manufactured in a powder form.

Then, the first silicon compound dried and manufactured in a powder form is pressurized to manufacture the silicon positive electrode thin film layer in a thin film form, and the plurality of manufactured silicon positive electrode thin film layers are stacked and pressurized to manufacture the first silicon multilayer thin film part.

When the first silicon multilayer thin film part is manufactured by the above described manner, moldability thereof is low but internal resistance of a battery may be decreased because pores are not generated in the first silicon multilayer thin film part.

When the first silicon multilayer thin film part is manufactured as described above, the first silicon multilayer thin film part is bonded to a collector to manufacture the positive electrode collector. Here, the first silicon multilayer thin film part may be bonded to the collector using a separate bonding material or bonding member, or using a simple attachment, printing, or pressing manner. Here, the collector is formed of a metal material in a porous net shape, and a terminal for supplying a current may be formed on an end portion thereof.

Further, the manufacturing of the second silicon multilayer thin film part is started from mixing the second silicon compound and a bonding material. Here, the second silicon compound may be provided with silicon nitrate, and the bonding material may be provided with a polymeric cross-linking agent.

When the second silicon compound and the bonding material are mixed as described above, the mixed material is pressurized to manufacture the silicon negative electrode thin film layer in a thin film shape.

The plurality of silicon negative electrode thin film layers manufactured as described above are stacked and pressurized to manufacture the second silicon multilayer thin film part.

When the second silicon multilayer thin film part is manufactured by the above described manner, moldability thereof is high but internal resistance of a battery may be increased because pores are generated in the second silicon multilayer thin film part.

Further, the second silicon multilayer thin film part may be manufactured as described below.

Each particle of the second silicon compound is coated with a bonding material, and the coated second silicon compound is dried and manufactured in a powder form.

Then, the second silicon compound dried and manufactured in a powder form is pressurized to manufacture the silicon negative electrode thin film layer in a thin film shape, and the plurality of manufactured silicon negative electrode thin film layers are stacked and pressurized to manufacture the second silicon multilayer thin film part.

When the second silicon multilayer thin film part is manufactured by the above described manner, moldability thereof is low but internal resistance of a battery may be decreased because pores are not generated in the second silicon multilayer thin film part.

When the second silicon multilayer thin film part is manufactured as described above, the second silicon multilayer thin film part is bonded to a collector to manufacture the negative electrode collector. Here, the second silicon multilayer thin film part may be bonded to the collector using a separate bonding material or bonding member, or using a simple attachment, printing, or pressing manner. Here, the collector may be formed of a metal material in a porous net shape, and a terminal for supplying a current may be formed on an end portion thereof.

When the positive electrode collector and the negative electrode collector are manufactured as described above, the positive electrode collector and the negative electrode collector are bonded to the electrolyte part.

When the electrolyte part is in a solid state, the first and second silicon multilayer thin film parts of the positive electrode collector and the negative electrode collector are bonded to be in contact with an outer surface of the solid electrolyte. Here, the first and second silicon multilayer thin film parts and the solid electrolyte may be bonded using a separate bonding material or bonding member, or using a simple attachment, printing, spaying, or pressing manner. Here, the solid electrolyte is formed to have a greater width than those of the first and second silicon multilayer thin film parts to prevent a short circuit between a positive electrode and a negative electrode.

Further, when the electrolyte part is in a liquid state, a separation layer is interposed between the first and second silicon multilayer thin film parts of the positive electrode collector and the negative electrode collector, and the first and second silicon multilayer thin film parts and the separation layer are bonded to be formed in an impregnated form in the liquid electrolyte.

In the silicon secondary battery manufactured by the above described manner, since the first silicon compound or second silicon compound is stacked and pressurized multiple times to manufacture the first or second silicon multilayer thin film part, the density of the first or second silicon multilayer thin film part is increased and the current density and capacity of the silicon secondary battery can be increased.

<Third Embodiment>

Hereinafter, a silicon secondary battery according to a third embodiment of the present invention will be described.

The silicon secondary battery according to the third embodiment of the present invention includes a positive electrode coated with a positive electrode active material which generates silicon cations when the silicon secondary battery is charged and generates silicon anions when the silicon secondary battery is discharged, a negative electrode coated with a negative electrode active material which generates silicon anions when the silicon secondary battery is charged and which generates silicon cations when the silicon secondary battery is discharged, and a solid electrolyte layer located between the positive electrode and negative electrode and configured to deliver silicon ions between the positive electrode active material and the negative electrode active material when the silicon secondary battery is charged and discharged, wherein the present invention relates to the silicon secondary battery including a mesh plate included in the positive electrode active material and/or the negative electrode active material.

First, the positive electrode is a metal plate having a predetermined thickness, and a positive electrode active material is coated on one side thereof. The positive electrode active material may be provided with silicon carbide (SiC), but is not limited thereto.

The negative electrode is also provided with a metal plate having a predetermined thickness, and a negative electrode active material is coated on one side thereof. The negative electrode active material may be provided with silicon nitrate ($Si_3N_4$), but is not limited thereto.

Figure 4:
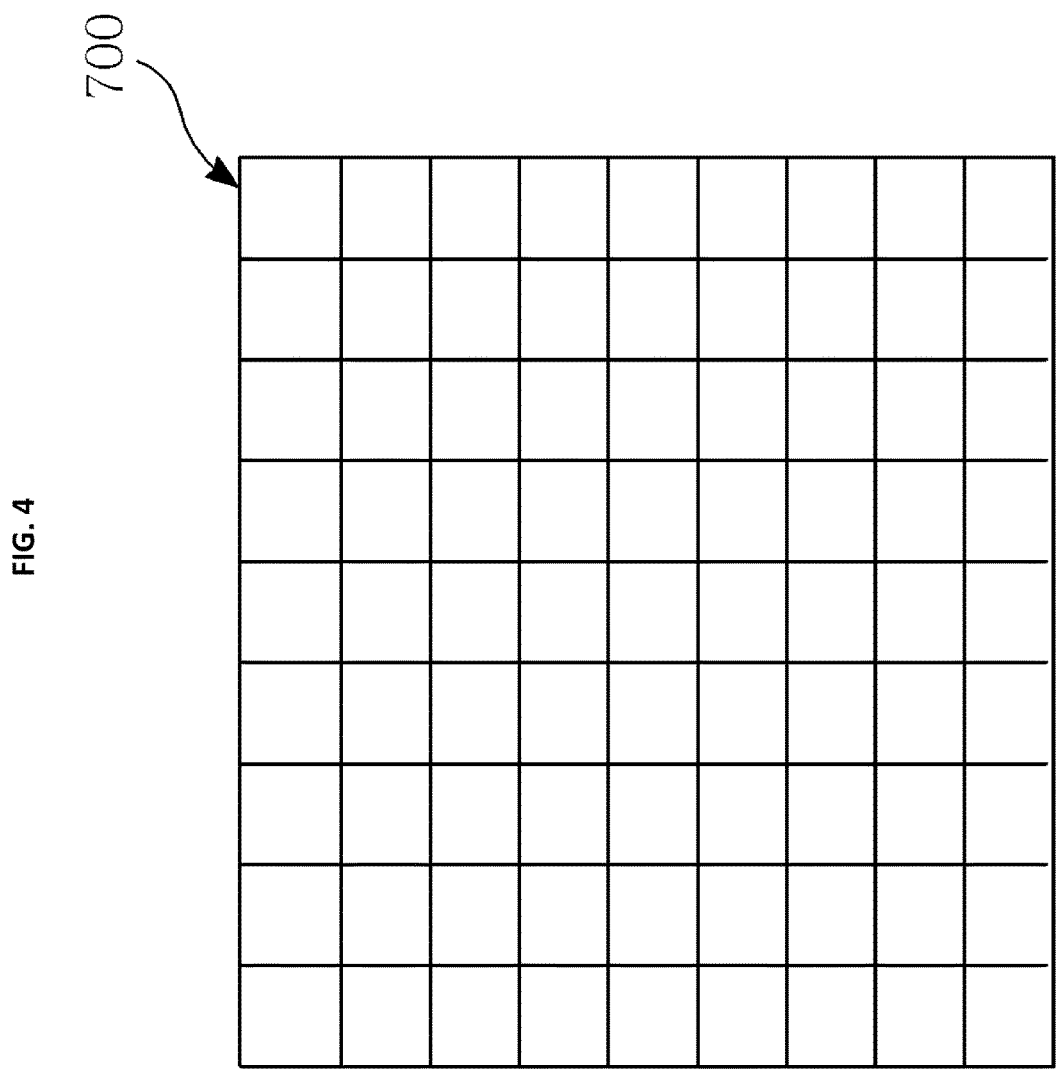
FIG. 4 is a view illustrating an example of a mesh plate included in an active material of a silicon secondary battery according to a third embodiment of the present invention.

The mesh plate is included in the positive electrode active material and the negative electrode active material coated as described above. As shown in FIG. 4, the mesh plate is formed in a net form, in which empty spaces are formed, and inserted into the positive electrode active material and the negative electrode active material. Here, the mesh plate is formed of a metal paste. The metal paste is a gel-type product manufactured by mixing a powder of a metal and a liquid-state organic material and is a metal material on which a metal pattern is easily formed by a silk-screen or inkjet method. The metal paste may be easily manufactured due to characteristics of having only a metal material by burning out or vaporizing a liquid-state organic material at low temperature, and when a pattern for printing is manufactured by a silk-screen method, a thickness of 30 µm or less may be manufactured so that an increase in the thickness thereof is very small.

As described above, the positive electrode and the negative electrode which are respectively coated with the positive electrode active material and the negative electrode active material are bonded to the solid electrolyte layer to form the silicon secondary battery. Here, the positive electrode and the negative electrode are bonded to the solid electrolyte layer so that the positive electrode active material and the negative electrode active material are in contact with the solid electrolyte layer.

The silicon secondary battery formed as described above is charged and discharged by movement of electrons and serves as a battery.

Hereinafter, a method of manufacturing the silicon secondary battery according to the third embodiment of the present invention will be described in detail.

First, a base film is provided. The base film is formed of a synthetic resin material and has solubility.

Then, a positive electrode active material is coated on one surface of the base film.

As described above, when the positive electrode active material is coated on the one surface of the base film, punching is performed on the positive electrode active material to form a plurality of holes.

Then, a metal paste is coated on an upper portion of the positive electrode active material to form a mesh plate 700. Here, as shown in FIG. 4, the mesh plate 700 is formed in a net form and formed by printing in a silk-screen manner. Here, the mesh plate 700 is disposed on upper portions of holes made by punching the positive electrode active material and the metal paste is introduced into the holes.

When the mesh plate is formed as described above, an upper portion thereof is coated with the positive electrode active material again.

Then, the positive electrode active material including the mesh plate therein is manufactured by a pressing method using heat and pressure.

When the positive electrode active material is manufactured as described above, the negative electrode active material is manufactured using the same method as the above described method.

First, a base film is provided. The base film is formed of a synthetic resin material and has solubility.

Then, a negative electrode active material is coated on one surface of the base film.

As described above, when the negative electrode active material is coated on the one surface of the base film, punching is performed on the negative electrode active material to form a plurality of holes.

Then, a metal paste is coated on an upper portion of the negative electrode active material to form a mesh plate. Here, as shown in FIG. 4, the mesh plate is formed in a net form and formed by printing in a silk-screen manner. Here, the mesh plate is disposed on upper portions of holes made by punching the negative electrode active material and the metal paste is introduced into the holes.

When the mesh plate is formed as described above, an upper portion thereof is coated with the negative electrode active material again.

Then, the negative electrode active material including the mesh plate therein is manufactured by a pressing method using heat and pressure.

When the positive electrode active material and the negative electrode active material are manufactured as described above, the base films are removed from the positive electrode active material and the negative electrode active material, and then the metal plates instead of the base films are mounted to manufacture the positive electrode and the negative electrode.

As described above, when the positive electrode and the negative electrode are manufactured, the positive electrode, the solid electrolyte layer, and the negative electrode are sequentially stacked. Here, the positive electrode, the solid electrolyte layer, and the negative electrode are stacked so that the positive electrode active material and the negative electrode active material are in contact with the solid electrolyte layer.

Then, the silicon secondary battery is manufactured by a pressing method using heat and pressure.

In the silicon secondary battery using the solid electrolyte, the mesh plate in a net form is included in an electrode using a metal paste, holes are made in connection portions of the mesh plate so that the metal paste is introduced into spaces in the holes, and thus higher electron transfer speed can be provided when electrons generated between the electrode and the electrolyte pass through the electrode.

Further, non-uniform reactivity between the electrode and the electrolyte formed to be planar is changed to uniform reactivity by the mesh plate in a net form, and thus conditions under which electrons are uniformly moved can be formed. Further, since movement of electrons is quickly performed through the holes made in the electrode, stacking is easily achieved using a metal thin film or by coating when secondary batteries are stacked.

<Fourth Embodiment>

Hereinafter, a silicon secondary battery unit according to a fourth embodiment of the present invention will be described in detail.

Figure 5:
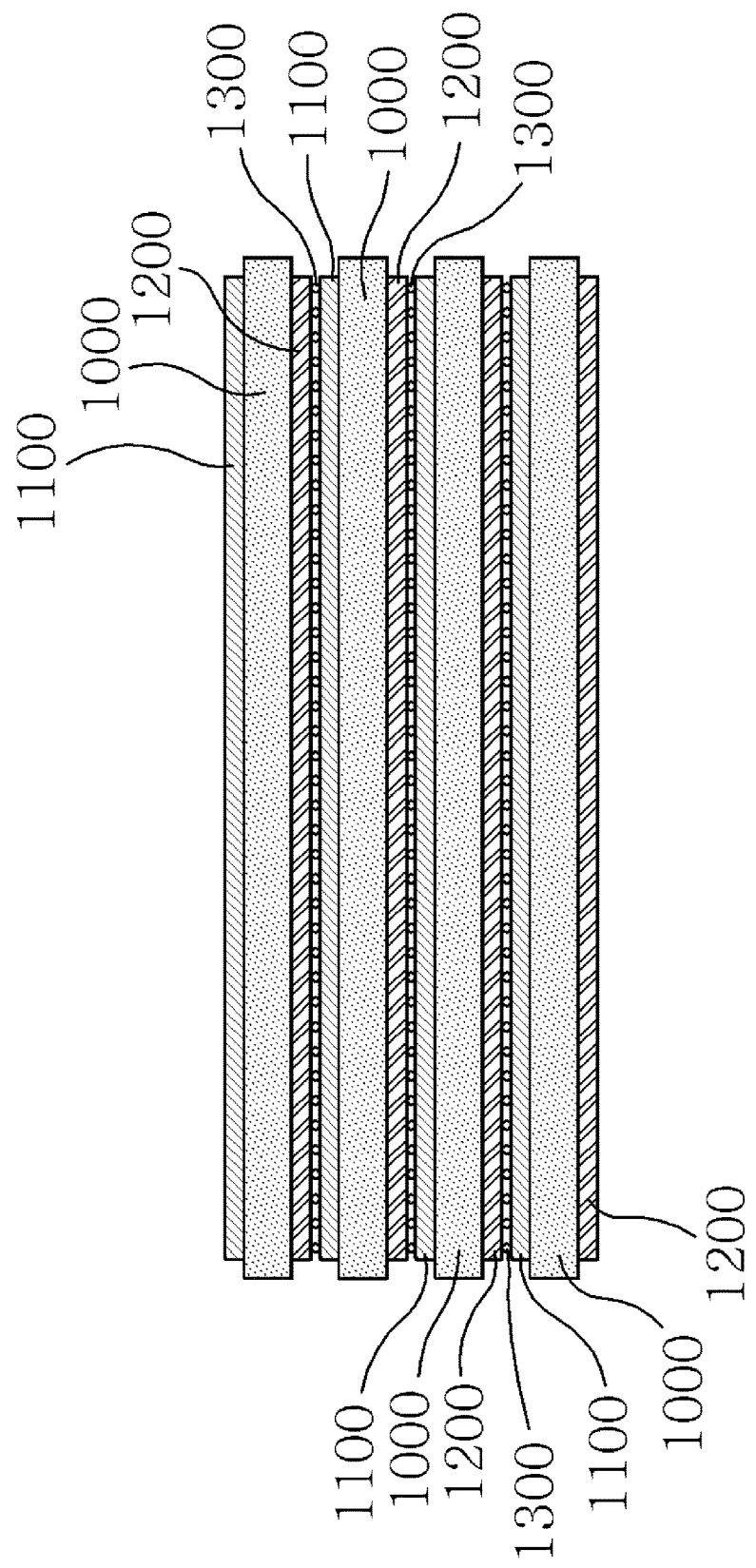
FIG. 5 is a view illustrating a structure of a silicon secondary battery unit according to a fourth embodiment of the present invention.

Referring to FIG. 5, in the silicon secondary battery unit according to the fourth embodiment of the present invention, a plurality of silicon secondary battery unit cells each including a positive electrode active material layer 1100 formed of a first silicon compound which generates silicon cations when the silicon secondary battery is charged and generates silicon anions when the silicon secondary battery is discharged, a negative electrode active material layer 1200 formed of a second silicon compound which generates silicon anions when the silicon secondary battery is charged and generates silicon cations when the silicon secondary battery is discharged, and a solid electrolyte layer 1000 are stacked to form a unit, the plurality of silicon secondary battery unit cells are connected in series and stacked, and a common collector layer 1300 is interposed between the positive electrode active material layer 1100 and the negative electrode active material layer 1200 so that charges are collected.

Since the first silicon compound and the second silicon compound are described in detail above, repeated descriptions thereof will be omitted.

In the fourth embodiment of the present invention, the positive electrode active material layer 1100 may be either a single layer structure or a multilayer structure, but it is preferable to have a first silicon multilayer thin film part in which a plurality of silicon positive electrode thin film layers, each of which is formed of a first silicon compound which generates silicon cations when the silicon secondary battery is charged and generates silicon anions when the silicon secondary battery is discharged, are stacked, in order to maximize an electric capacity and charge and discharge characteristics thereof based on a volume of the silicon secondary battery unit.

The negative electrode active material layer may also be either a single layer structure or a structure, but it is preferable to have a second silicon multilayer thin film part in which a plurality of silicon negative electrode thin film layers, each of which is formed of a second silicon compound which generates silicon anions when the silicon secondary battery is charged and generates silicon cations when the silicon secondary battery is discharged, are stacked, in order to maximize the electric capacity and charge and discharge characteristics thereof based on the volume of the silicon secondary battery unit.

In the fourth embodiment of the present invention, the common collector layer 1300 performs both functions of a positive electrode collector and a negative electrode collector by being stacked between the positive electrode active material layer and the negative electrode active material layer included in the silicon secondary battery unit of the present invention, stainless steel, nickel, and so on may be used for a material thereof, a shape thereof is not particularly limited, and it is preferable to have a porous net shape or foamed shape to reduce interfacial resistance by increasing an interface contact area between the common collector layer 1300 and the active material layers 1100 and 1200 and to improve interfacial adhesion in a pressing process. The porous net shape may be a two-dimensional planar porous net shape or three-dimensional porous net shape.

Further, when the common collector layer 1300 has a porous net shape or foamed shape, a surface of the common collector layer 1300 is coated with one of gold, silver, and conductive polymer, and thus conductivity of electrons and ions of the common collector layer 1300 is further improved and interfacial resistance is further decreased.

Particularly, when the surface is coated with the conductive polymer, because the conductive polymer simultaneously serves as a conductor and a bonding material, the interfacial adhesion is further increased. The conductive polymer may be any polymer having conductivity, but it is preferable to use any one selected from the group consisting of polypyrrole, polyaniline, polythiophene, and polyacetylene in view of improving conductivity and interfacial adhesion of the collector.

According to the fourth embodiment of the present invention, since the plurality of silicon secondary battery unit cells forming the silicon secondary battery unit has a structure in which the plurality of silicon secondary battery unit cells are connected in series and stacked, high voltage and high output power characteristics can be achieved when compared to a conventional secondary battery unit having a structure in which the plurality of silicon secondary battery unit cells are connected in parallel.

Further, since a common collector layer is used when the plurality of silicon secondary battery unit cells are connected in series and integrated to form the silicon secondary battery unit, about half of the number of collectors included in each silicon secondary battery unit is reduced, and thus the weight of the collectors having a relatively large portion in the total weight of the silicon secondary battery unit can be remarkably reduced, and a silicon secondary battery unit product that is much lighter than a conventional silicon secondary battery unit product can be manufactured.

Figure 6:
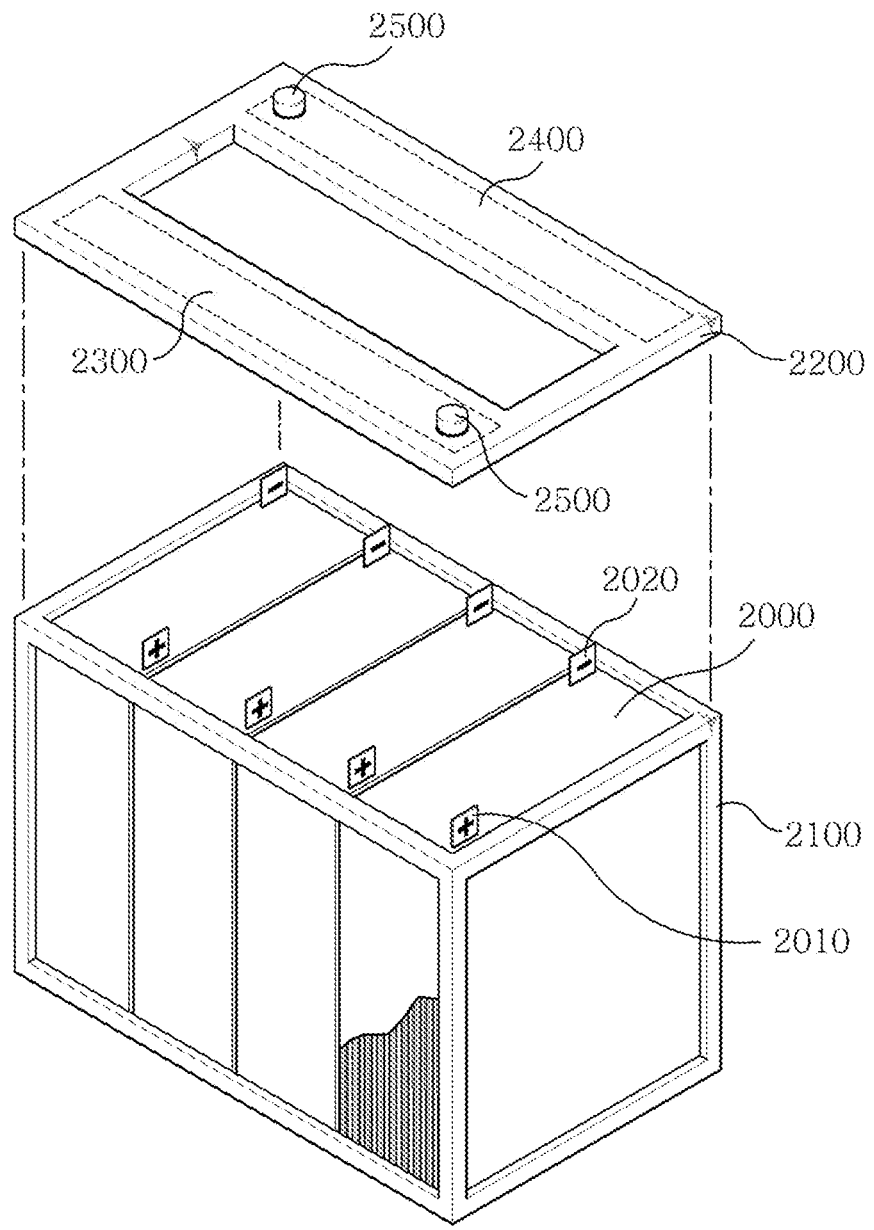
FIG. 6 is a view illustrating an example of a battery module for an electric vehicle to which the silicon secondary battery unit according to the fourth embodiment of the present invention is applied.

A battery module which supplies power to an electric vehicle as an application example of the silicon secondary battery unit according to the fourth embodiment of the present invention will be described in more detail with reference to FIG. 6 below.

The battery module for an electric vehicle according to the present invention includes a case 2100 for accommodating a silicon secondary battery therein, a cover 2200 which covers an opening of the case and is provided with output terminals 2500 which outputs power, and a plurality of silicon secondary battery units 2000 according to the fourth embodiment which are disposed in the case 2100, and the silicon secondary battery units 2000 are disposed to be connected in series.

The case 2100 may have any structure in which a silicon secondary battery may be accommodated, but it is preferable to have a frame structure, through which external air smoothly passes, in order to overcome degradation of charge and discharge characteristics and short lifetime of battery product caused by an increase in temperature of a battery module and heat accumulated in the battery module. The structure of the case 2100 shown in FIG. 6 is only an example of a frame structure, and various types of frame structures in addition to the example may be employed.

It is preferable that the cover 2200 include a positive electrode busbar 2300 connected to positive electrode terminals 2010 of the silicon secondary battery units 2000 and electrically connected the output terminal 2500 and a negative electrode busbar 2400 connected to negative electrode terminals 2020 of the silicon secondary battery units 2000 and electrically connected to the output terminal 2500 in consideration of structural efficiency of the battery module.

Materials of the case 2100 and the cover 2200 are not particularly limited, but the materials may preferably be an insulating material to prevent generation of an electrical short circuit caused when output power is distributed to somewhere other than an output terminal, and particularly, it is most preferable to use plastic as the insulating material to secure sufficient durability and light weight of the case and the cover.

When the battery module of the present invention is applied to an electric vehicle, since the silicon secondary battery units including the common collector layer are used, the weight thereof is smaller than that of a conventional battery module, and thus a mileage of the electric vehicle can be improved.

Particularly, since the plurality of silicon secondary battery units included in the battery module are formed to have a structure in which a plurality of silicon secondary battery unit cells are connected in series, the battery module having high capacity and high output power can be manufactured, and furthermore, when active material layers of silicon secondary battery unit cells included in the silicon secondary battery unit are stacked as the structure described above, a battery module product can be manufactured to have higher capacity and output power than a conventional battery module for an electric vehicle in the same volume.

<Fifth Embodiment>

Hereinafter, a silicon secondary battery according to a fifth embodiment of the present invention will be described in detail.

The fifth embodiment of the present invention relates to a silicon secondary battery which is charged and discharged using silicon ions, and more particularly, to a silicon secondary battery including a first silicon multilayer thin film part in which a plurality of silicon positive electrode thin film layers each formed of a first silicon compound, which generates silicon cations when the silicon secondary battery is charged and generates silicon anions when the silicon secondary battery is discharged, are stacked, a second silicon multilayer thin film part in which a plurality of silicon negative electrode thin film layers each formed of a second silicon compound, which generates silicon anions when the silicon secondary battery is charged and generates silicon cations when the silicon secondary battery is discharged, are stacked, and a collector configured to collect charges, and the collector has a porous net shape.

In the fifth embodiment of the present invention, the collector is bonded to one end of each of the first silicon multilayer thin film part and the second silicon multilayer thin film part to collect charges, and stainless steel, nickel, and so on may be used for a material thereof.

A shape of the collector is not particularly limited, but it is preferable to have a porous net shape or foamed shape to reduce interfacial resistance by increasing an interface contact area between the collector and the first and second silicon multilayer thin film parts and to improve interfacial adhesion in a pressing process. The porous net shape may be a two-dimensional planar porous net shape or three-dimensional porous net shape.

Further, when the collector has a porous net shape or foamed shape, a surface of the collector is coated with one of gold, silver, and conductive polymer, and thus conductivity of electrons and ions of the collector is further improved and interfacial resistance is further decreased.

Particularly, when the collector is coated with the conductive polymer, because the conductive polymer simultaneously serves as a conductor and a bonding material, the interfacial adhesion is further increased. The conductive polymer may be any polymer having conductivity, but it is preferable to use any one selected from the group consisting of polypyrrole, polyaniline, polythiophene, and polyacetylene in view of improving conductivity and interfacial adhesion of the collector.

<Sixth Embodiment>

Hereinafter, a silicon secondary battery according to a sixth embodiment of the present invention will be described in detail.

The sixth embodiment of the present invention relates to a micro-battery including a silicon secondary battery, and the micro-battery includes a silicon secondary battery including a first silicon multilayer thin film part in which a plurality of silicon positive electrode thin film layers each formed of a first silicon compound, which generates silicon cations when the silicon secondary battery is charged and generates silicon anions when the silicon secondary battery is discharged, are stacked, a second silicon multilayer thin film part in which a plurality of silicon negative electrode thin film layers each formed of a second silicon compound, which generates silicon anions when the silicon secondary battery is charged and generates silicon cations when the silicon secondary battery is discharged, are stacked, and a solid electrolyte layer located between the first silicon multilayer thin film part and the second silicon multilayer thin film part and configured to deliver silicon ions between the first silicon multilayer thin film part and the second silicon multilayer thin film part when the silicon secondary battery is charged and discharged.

Further, in the sixth embodiment of the present invention, it is preferable that a positive electrode collector configured to collect charges be bonded to one side surface of the first silicon multilayer thin film part, a negative electrode collector configured to collect charges be bonded to one side surface of the second silicon multilayer thin film part, one side end of the positive electrode collector be attached to a substrate, and at least a part of the negative electrode collector other than a surface thereof in contact with the second silicon multilayer thin film part be attached to the substrate for electrically connecting the collectors to the substrate for charging and discharging the silicon secondary battery.

Further, the micro-battery according to the sixth embodiment of the present invention preferably has a structure in which at least the second silicon multilayer thin film part, the solid electrolyte layer, and the negative electrode collector are insulated from the positive electrode collector to prevent a short circuit between electrodes, and to this end, it is preferable that a space be formed between side surfaces of the second silicon multilayer thin film part, the solid electrolyte layer, and the negative electrode collector and the positive electrode collector.

The space may be an empty space, but it is preferable that the space be filled with an insulating material to further increase insulation and to further improve durability of the micro-battery.

In the sixth embodiment of the present invention, the first silicon compound and/or the second silicon compound may include elastic carbon to prevent the degradation of the charge and discharge characteristics of an active material layer because the volume of the active material layer is increased as the silicon secondary battery is repeatedly charged and discharged. Since the first silicon compound and/or the second silicon compound include elastic carbon, even when silicon particles are enlarged due to repeated charge and discharge, a volume offset effect may be shown by the elastic carbon, thereby suppressing the bulking of the entire active material layer.

However, when the first silicon compound and/or the second silicon compound include elastic carbon, since ion mobility or electron conductivity may be slightly lowered due to a gap between silicon particles and elastic carbon, in order to compensate for this, it may be preferable to further include conductive carbon or to use fullerene simultaneously having elasticity and high ion mobility or electron conductivity as the elastic carbon.

Further, in the sixth embodiment of the present invention, the first silicon compound and/or the second silicon compound may include inactive material particles, which do not participate in a bulking reaction of the active material layer, to prevent the degradation of the charge and discharge characteristics caused when the volume of the active material layer is increased as the silicon secondary battery is repeatedly charged and discharged. The inactive material particles are one or more metal particles selected from the group consisting of Mo, Cu, Fe, Co, Ca, Cr, Mg, Mn, Nb, Ni, Ta, Ti, and V.

However, when the first silicon compound and/or the second silicon compound include the inactive material particles as described above, since the electric capacity of the silicon secondary battery may be slightly reduced, it may be preferable to further include conductive carbon or conductive polymer.

In the sixth embodiment of the present invention, the positive electrode thin film layer and/or the negative electrode thin film layer may have any shape which may form a layer, but it may be preferable to have a mesh shape to minimize the risk of breakage of the thin film layer due to contraction and expansion of the positive electrode thin film layer and/or the negative electrode thin film layer caused by repeatedly charging and discharging the silicon secondary battery.

In the sixth embodiment of the present invention, the positive electrode thin film layer and/or the negative electrode thin film layer are not particularly limited in surface shape, but it is preferable that an interface contact area with an adjacent layer be widen and concavo-convex shapes be formed on one or both surfaces of the thin film layer to reduce interfacial resistance.

In the sixth embodiment of the present invention, the first silicon multilayer thin film part and/or the second silicon multilayer thin film part may be preferable to include an interlayer formed of a metal or carbon allotrope to improve charge and discharge characteristics and to secure uniform ion conductivity.

A thickness of the interlayer is not particularly limited, but it may be preferable that the thickness be smaller than those of the first silicon multilayer thin film part and the second silicon multilayer thin film part in view of increasing an electric capacity thereof.

A metal included in the interlayer may be any metal having high electric conductivity, but it may be preferable to use one selected among aluminum, gold, and silver or an alloy containing two or more of aluminum, gold, and silver in view of maximizing the performance of charge and discharge of a battery.

Further, a type of carbon allotrope included in the interlayer is not particularly limited, but it may be preferable to use one selected among graphene, a carbon nanotube, and fullerene in view of securing uniform ion conductivity in an electrode.

An example shown in FIG. 7 will be described below to facilitate understanding of the micro-battery according to the sixth embodiment of the present invention.

Referring to FIG. 7, in the micro-battery of the present invention, a first silicon multilayer thin film part 3200 corresponding to a positive electrode active material layer and having a stacked structure, a solid electrolyte layer 3100, and a second silicon multilayer thin film part 3300 corresponding to a negative electrode active material layer and having a stacked structure are sequentially pressurized and stacked, a positive electrode collector 3400 is bonded to an upper surface of the first silicon multilayer thin film part 3200, and a negative electrode collector 3500 is bonded to a lower surface of the second silicon multilayer thin film part 3300.

Particularly, referring to FIG. 7, one side end of the positive electrode collector 3400 is bonded to a surface of a substrate 3000, a surface of the negative electrode collector 3500 opposite a surface of the negative electrode collector 3500 in contact with the second silicon multilayer thin film part 3300 is bonded to the substrate 3000, and thus the micro-battery of the present invention is electrically connected to the substrate and may be charged and discharged.

Further, referring to FIG. 7, a space 3700 is formed between right side surfaces of the first silicon multilayer thin film part 3200, the solid electrolyte layer 3100, the second silicon multilayer thin film part 3300, and the negative electrode collector 3500 and the positive electrode collector 3400, and the space 3700 is filled with an insulating material in FIG. 7.

Among the electronic components included in a printed circuit board (PCB), there are components which consume a constant current and continuously maintain constant functions such as an operation of a timer. In order to maintain operations of the components included therein, a button-type battery is inserted into the PCB or a lithium-based battery is mounted therein to ensure operations of the components.

A button-type battery is a primary battery and has an advantage of long operating time, but has a burden of leakage and replacement after the battery is discharged, and a lithium-based battery is disadvantageous in that the lithium-based battery is bulky and has instability with respect to shock heat.

However, since the micro-battery according to the sixth embodiment of the present invention may be manufactured in a thin film type and may be also manufactured in a chip type, the micro-battery can be made to have a large-capacity power supply structure using a cross section or a space having no component of a PCB and can be a secondary battery capable of being charged and discharged which is chargeable when the PCB operates.

Further, a shape of the micro-battery according to the sixth embodiment of the present invention is not limited when bonded to a planer surface, and can be mounted on a PCB by being manufactured to have a thickness of 2 mm when manufactured in a chip type.

Therefore, another aspect of the present invention is related to a PCB substrate having a portion on which the micro-battery according to the sixth embodiment is mounted as a backup power source.

Further, since the micro-battery according to the present invention may be manufactured to be integrated with upper and lower ends of a chip by a deposition process in a manufacturing process of a semiconductor chip, the micro-battery can be manufactured in a small size as an auxiliary component mounted on the outside and can maintain power for a short time as a backup power source against instant discharging.

Therefore, still another aspect of the present invention is related to an integrated semiconductor chip having a portion on which the micro-battery according to the sixth embodiment is deposited as a backup power source.

In addition, the micro-battery according to the sixth embodiment of the present invention is provided as a component and can be utilized for a wide-band semiconductor, a super capacitor, etc.

<Seventh Embodiment>

Hereinafter, a silicon secondary battery according to a seventh embodiment of the present invention will be described in detail.

The silicon secondary battery according to the sixth embodiment of the present invention has a basic structure in which a positive electrode is formed of silicon carbide of which a chemical formula is SiC, a negative electrode is formed of silicon nitride of which a chemical formula is $Si_3N_4$, and a nonaqueous electrolyte, which is made by any one type of an ion exchange resin among polymers having a cationic sulfonic acid group (—$SO_3H$), a carboxyl group (—COOH), an anionic quaternary ammonium group (—N$(CH_3)^2C_2H_4OH$), or a substituted amino group (—NH$(CH_3)^2$) as a binder, is employed between the positive electrode and the negative electrode, and is a solid secondary battery of which the positive electrode generates cations of silicon ($Si^+$) and the negative electrode generates anions of silicon ($Si^-$) when the silicon secondary battery is charged.

Further, in another structure of the silicon secondary battery, the positive electrode may be formed of silicon carbide of which a chemical formula is SiC, and the negative electrode may be formed of silicon nitride of which a chemical formula is $Si_3N_4$.

Such a silicon secondary battery includes a nonaqueous electrolyte made by any one type of ion exchange inorganic material among tin chloride ($SnCl_3$), a solid solution of magnesium zirconium oxide ($ZrMgO_3$), a solid solution of calcium zirconium oxide ($ZrCaO_3$), zirconium oxide ($ZrO_2$), silicon-βalumina ($Al_2O_3$), nitrogen monoxide silicon carbide (SiCON), and silicon zirconium phosphate ($Si_2Zr_2PO$) and employed between the positive electrode and the negative electrode, and is a secondary battery including a solid electrolyte part of which the positive electrode generates cations of silicon ($Si^+$) and the negative electrode generates anions of silicon ($Si^-$) when the silicon secondary battery is charged, and the electrolyte part may be made in a liquid type.

A method of manufacturing the silicon secondary battery includes forming a positive electrode collector layer by metal-sputtering on a base, forming a positive electrode layer by vapor deposition with silicon carbide (SiC) on the positive electrode collector layer, forming a nonaqueous electrolyte layer by coating on the positive electrode layer, forming a negative electrode layer by vapor deposition with silicon nitride ($Si_3N_4$) on the nonaqueous electrolyte layer, and forming a negative electrode collector layer by metal-sputtering.

In a basic principle of the silicon secondary battery, the positive electrode includes an SiC compound which is in the most stable state of silicon carbide and the negative electrode includes an $Si_3N_4$ compound which is in the most stable state of silicon nitride.

When the silicon secondary battery is charged by the positive electrode, silicon is easier to be changed to oxidation number than carbon, and in addition to this, because the most stable state of silicon is a tetravalent state and the second stable state thereof is a binary state, the following chemical reaction is performed.

$2SiC \rightarrow SiC_2 + Si^+ + e^-$

Conversely, when the silicon secondary battery is discharged, the following chemical reaction is performed.

$SiC_2 + Si^+ + e^- \rightarrow 2SiC$

In $Si_3N_4$, which is the most stable state of silicon nitride, of the negative electrode, a state of silicon is changed from a tetravalent state to a trivalent state, a state of nitrogen is changed from a trivalent state to a binary state, the compound is then changed to an $Si_2N_3$ compound which is in the second stable state, and thus the following chemical formula is made.

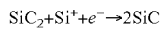

$3Si_3N_4 + e^- \rightarrow 4Si_2N_3 + Si^-$

Conversely, when the silicon secondary battery is discharged, the following chemical reaction is performed.

$4Si_2N_3 + Si^- \rightarrow 3Si_3N_4 + e^-$

The silicon secondary battery may express charging and discharging to the following chemical reaction, but an additional material may be included therein so that charging and discharging efficiency can be improved.

Generally, both of the SiC compound and the $Si_3N_4$ compound have a crystalline structure, and for example, when the positive electrode and the negative electrode are formed by a general method such as a plasma discharging method or the like, silicon carbide made by the SiC compound having a crystalline structure and silicon nitride made by the $Si_3N_4$ compound having a crystalline structure are formed.

However, to easily and smoothly charge and discharge the silicon secondary battery which generates silicon ions ($Si^+$ and $Si^-$), each compound preferably is in an amorphous state instead of having a crystalline structure, that is, an amorphous structure.

To this end, as described below, a method of stacking both of the positive electrode and the negative electrode by vapor deposition is suitably employed.

In addition, a space between the positive electrode and the negative electrode is divided into two spaces, both of cationic and anionic electrolytes may be employed so that one side (e.g., an upper side) is filled with the cationic electrolyte and the other side (e.g., a lower side) is filled with the anionic electrolyte.

A nonaqueous electrolyte in a fixed state is used for the electrolyte of the silicon secondary battery, and the reason is that, in the case of the nonaqueous electrolyte in the fixed state, the positive electrode and the negative electrode can be bonded in a stable state and efficient conductivity can also be achieved by enabling the positive electrode to be near the negative electrode due to a form of a thin film.

The nonaqueous electrolyte may include either an ion exchange resin of a polymer or an ion exchange inorganic compound of a metal oxide.

The ion exchange resin may include any polymer having any one type of a cationic sulfonic acid group (—$SO_3H$), a carboxyl group (—COOH), an anionic quaternary ammonium group (—$N(CH_3)^2C_2H_4OH$), a substituted amino group (—$NH(CH_3)^2$), and so on as a binder.

However, polyacrylamide methyl propanesulfonic acid (PAMPS) having a sulfonic acid group (—$SO_3H$) can be suitably employed in that electrons ($e^-$) moves smoothly without any difficulty.

However, when the ion exchange resin of a polymer is employed and only the ion exchange resin simply fills between the positive electrode and the negative electrode, a case in which a suitable gap for smoothly moving electrons ($e^-$) may not be formed can occur.

To cope with the above situation, it is preferable to employ an embodiment in which a polymer alloy having a crystalline structure formed by a blend with the ion exchange resin and another crystalline polymer is employed as a nonaqueous electrolyte.

Further, to implement the blend with the ion exchange resin and another crystalline polymer, since the ion exchange resin has polarity, it is necessary to cope with the depolarization of the polarity of the ion exchange resin by the crystalline polymer.

In the case of the above blend, availability of the blend can be predicted with a high probability on the basis of a difference between solubility parameters (SP values) of the ion exchange resin and the crystalline polymer, and furthermore, on the basis of a value of an χ-parameter based on a combination of the solubility parameters.

It is preferable that the crystalline polymer of the plate include an ion exchange resin such as atactic polystyrene (AA), a copolymer of acrylonitrile-styrene (AS), or a copolymer of AA, acrylonitrile, and styrene (AA-AS) for easy blending and maintaining crystallinity.

To maintain a crystalline structure of a mutually blended polymer alloy, it is necessary to consider a ratio of an amount of the ion exchange resin to an amount of another crystalline polymer, and a specific value thereof depends on the type of the ion exchange resin and another crystalline polymer.

However, when the polarity of the ion exchange resin is strong, a weight ratio of another crystalline polymer may be made more than ½ of the total weight.

When a cationic ion exchange resin is provided as described above and another crystalline polymer with respect to a cationic PAMPS employs AA, a copolymer of AS, or a copolymer of AA-AS, a weight ratio of the former to the latter is suitably in the range of 2:3 to 1:2.

The nonaqueous electrolyte is not limited to the above described ion exchange resin and may also employ an ion exchange inorganic material, and tin chloride ($SnCl_3$), a solid solution of magnesium zirconium oxide ($ZrMgO_3$), a solid solution of calcium zirconium oxide ($ZrCaO_3$), zirconium oxide ($ZrO_2$), silicon-βalumina ($Al_2O_3$), nitrogen monoxide silicon carbide (SiCON), phosphoric acid zirconium silicon ($Si_2Zr_2PO$), and so on may be employed as typical examples.

In the solid secondary battery, shapes of the positive electrode and the negative electrode and an arrangement state are not particularly limited.

However, an arrangement state of stacked materials in a plate shape and an arrangement state of stacked materials in a cylindrical shape may be employed.

In an actual solid secondary battery, bases are formed on both of a positive electrode and a negative electrode, and the positive electrode and negative electrode are connected to each other with a positive electrode collector layer and a negative electrode collector layer interposed therebetween.

A discharging voltage between a positive electrode and a negative electrode depends on a degree of a charging voltage and internal resistance of the electrodes, but, as described below, an embodiment of a secondary battery which maintains a discharging voltage of 4 to 3.5 V can be sufficiently designed in the case of a charging voltage of 4 to 5.5 V.

An amount of a current flowing between electrodes may be fixed in advance when the secondary battery is charged, but, as described below, an embodiment which changes a charging voltage to be in a range of 4 to 5.5 V and also maintains a discharging voltage of 4 to 3.5 V can be sufficiently designed by setting a current density per unit area of 1 $cm^2$ to about 1.0 A.

As described above, the exemplary embodiments of the silicon secondary battery and the method of manufacturing the same according to the present invention have been described.

The foregoing is illustrative of embodiments and is not to be construed as limiting thereof, and the scope of the present invention may be indicated by the appended claims rather than by the foregoing detailed description. It is intended that all changes and modifications that are within the meaning and the range of the claims and also come from the equivalent concept of the claims should be interpreted within the scope of the present invention.

The invention claimed is:

1. A micro-battery comprising a silicon secondary battery, the silicon secondary battery comprising:
    a first silicon multilayer thin film part in which a plurality of silicon positive electrode thin film layers each formed of a first silicon compound, which generates silicon cations when the silicon secondary battery is charged and generates silicon anions when the silicon secondary battery is discharged, are stacked;
    a second silicon multilayer thin film part in which a plurality of silicon negative electrode thin film layers each formed of a second silicon compound, which generates silicon anions when the silicon secondary battery is charged and generates silicon cations when the silicon secondary battery is discharged, are stacked;
    a solid electrolyte layer located between the first silicon multilayer thin film part and the second silicon multilayer thin film part and configured to deliver silicon ions between the first silicon multilayer thin film part and the second silicon multilayer thin film part when the silicon secondary battery is charged and discharged;
    a positive electrode collector bonded to one side surface of the first silicon multilayer thin film part; and
    a negative electrode collector bonded to one side surface of the second silicon multilayer thin film part,
    wherein a space is formed between the positive electrode collector and at least side portions of the second silicon multilayer thin film part, the solid electrolyte layer, and the negative electrode collector so that the second silicon multilayer thin film part, the solid electrolyte layer, and the negative electrode collector are insulated from the positive electrode collector.

2. The micro-battery of claim 1, further comprising a substrate, wherein the positive electrode collector has an extended portion extended from one end of the positive electrode collector towards the substrate to be in contact with the substrate.

3. The micro-battery of claim 1, further comprising a substrate, wherein, a surface of the negative electrode collector opposite to a surface of the negative electrode collector facing the second silicon multilayer thin film part is bonded to the substrate.

4. The micro-battery of claim 1, wherein the space is filled with an insulating material.

5. The micro-battery of claim 1, wherein at least one of the first silicon compound and the second silicon compound include elastic carbon.

6. The micro-battery of claim 5, wherein at least one of the first silicon compound and the second silicon compound further include conductive carbon.

7. The micro-battery of claim 5, wherein the elastic carbon includes fullerene or expanded graphite.

8. The micro-battery of claim 1, wherein at least one of the first silicon compound and the second silicon compound include inactive material particles.

9. The micro-battery of claim 8, wherein at least one of the first silicon compound and the second silicon compound further include conductive carbon or a conductive polymer.

10. The micro-battery of claim 1, wherein at least one of the positive electrode thin film layer and the negative electrode thin film layer are formed in a mesh shape.

11. The micro-battery of claim 1, wherein at least one of the first silicon multilayer thin film part and the second silicon multilayer thin film part include an interlayer formed of a metal or carbon allotrope.

12. The micro-battery of claim 11, wherein the interlayer is thinner than the first silicon multilayer thin film part and the second silicon multilayer thin film part.

13. The micro-battery of claim 11, wherein the metal includes any one selected among aluminum, gold, and silver or an alloy containing two or more of aluminum, gold, and silver.

14. The micro-battery of claim 11, wherein the carbon allotrope includes any one selected among graphene, a carbon nanotube, and fullerene.

15. The micro-battery of claim 1, wherein concave-convex shapes are formed on one surface or both surfaces of at least one of the positive electrode thin film layer and the negative electrode thin film layer.

16. The micro-battery of claim 1, further comprising a substrate on which the negative electrode collector is formed,
wherein the positive electrode collector has an extended portion extended from one end of the positive electrode collector towards the substrate to be in contact with the substrate; and
the space is formed between the extended portion of the positive electrode collector and the side portions of the second silicon multilayer thin film part, the solid electrolyte layer, and the negative electrode collector to insulate the second silicon multilayer thin film part, the solid electrolyte layer, and the negative electrode collector from the positive electrode collector.

17. The micro-battery of claim 1, further comprising a mesh plate in at least one of the first silicon multilayer thin film part and the second silicon multilayer thin film part.

18. A printed circuit board (PCB) substrate having a portion on which the micro-battery of claim 1 is mounted as a backup power source.

19. A semiconductor chip having a portion integrated with the micro-battery of claim 1, which serves as a backup power source, using a deposition method.

* * * * *